United States Patent [19]

Martin

[11] Patent Number: 4,737,468

[45] Date of Patent: Apr. 12, 1988

[54] PROCESS FOR DEVELOPING IMPLANTED BURIED LAYER AND/OR KEY LOCATORS

[75] Inventor: John E. Martin, Gilbert, Ariz.

[73] Assignee: Motorola Inc., Schaumburg, Ill.

[21] Appl. No.: 37,909

[22] Filed: Apr. 13, 1987

[51] Int. Cl.[4] .................. H01L 21/265; H01L 21/31
[52] U.S. Cl. .................................. 437/026; 357/91; 437/29; 437/31; 437/229
[58] Field of Search ............ 437/26, 31, 229, 29; 357/91

[56] References Cited

U.S. PATENT DOCUMENTS

| | | | |
|---|---|---|---|
| T918,008 | 1/1974 | Brack et al. | 317/235 R |
| 3,648,128 | 3/1972 | Kobayashi | 317/235 R |
| 4,242,791 | 1/1981 | Horng et al. | 29/578 |
| 4,253,888 | 3/1981 | Kikuchi | 437/229 |
| 4,272,776 | 6/1981 | Weijland et al. | 357/50 |
| 4,341,571 | 7/1982 | Hiss | 357/91 |
| 4,398,964 | 8/1983 | Malwah | 437/26 |
| 4,487,653 | 12/1984 | Hatcher | 156/644 |
| 4,517,731 | 5/1985 | Khan et al. | 437/29 |
| 4,546,534 | 10/1985 | Nicholas | 437/299 |
| 4,573,257 | 3/1986 | Hulseweh | 29/576 E |

*Primary Examiner*—Upendra Roy
*Attorney, Agent, or Firm*—Raymond J. Warren

[57] ABSTRACT

The present invention consists of a process of blanket implanting a key area and buried layer without the use of nitride or thick oxide layers. The key area is then etched leaving the surface of the key area below the surface of the buried layer. Upon growing an epitaxial layer, the key area will be identifiable by a step in the surface of the epi layer.

10 Claims, 3 Drawing Sheets

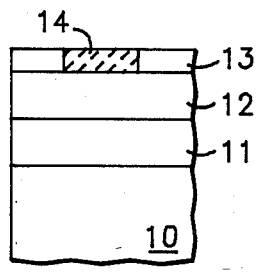
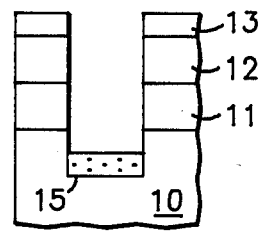
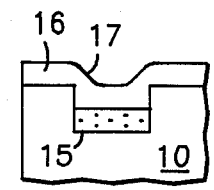
*FIG. 1*
— PRIOR ART —
*FIG. 2*
— PRIOR ART —
*FIG. 3*
— PRIOR ART —
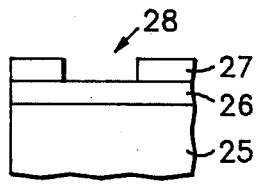
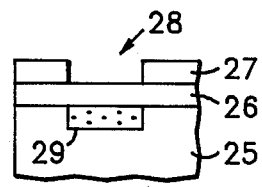
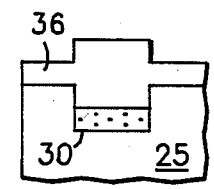
*FIG. 4*
*FIG. 5*
*FIG. 6*
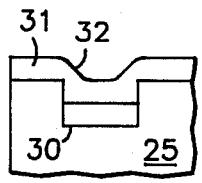
*FIG. 7*
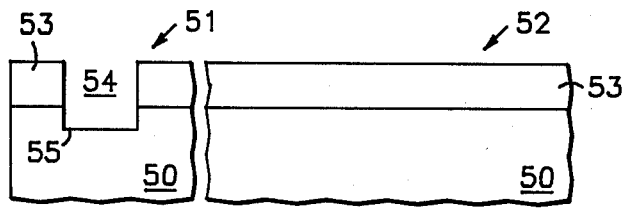
*FIG. 8*
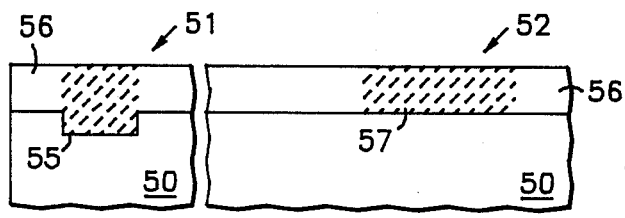
*FIG. 9*
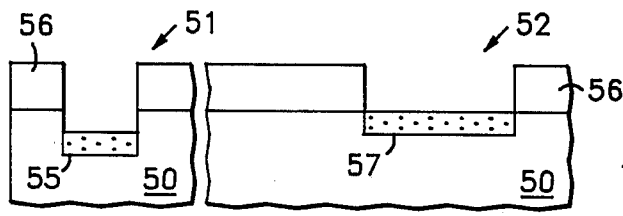
*FIG. 10*

PROCESS FOR DEVELOPING IMPLANTED BURIED LAYER AND/OR KEY LOCATORS

BACKGROUND OF THE INVENTION

The present invention relates, in general, to semiconductor processing and, more particularly, to processing implanted buried layers and/or key locators of semiconductor devices.

Buried layers and key locators are well known in the art of semiconductor manufacturing. Traditionally, a thick oxide layer and nitride layers are put down upon a wafer, such as a silicon wafer. The wafer is then masked and openings etched in the nitride delineating the desired position of the buried layer. The nitride is then used as a mask to etch the oxide layer. The buried layer is then formed and the mask, nitride layer and oxide layer are removed. As the thick oxide and nitride layers serve no purpose other than delineating the buried layer in the substrate, there is a need in the industry to eliminate these layers and the steps associated with depositing them on the wafer and removing them from the wafer.

SUMMARY OF THE INVENTION

Accordingly, it is an object of the present invention to provide a buried layer and/or key locator process that overcomes the above deficiencies.

Another object of the present invention is to provide a buried layer and/or key locator process that overcomes the need of a nitride layer.

Still another object of the present invention is to provide a buried layer and/or key locator process that overcomes the need of a thick oxide layer.

Yet another object of the present invention is to provide a buried layer and/or key locator process that reduces the required number of steps to produce a buried layer and/or key locator.

A particular embodiment of the present invention comprises the steps of: depositing a first photoresist on a substrate; developing the first photoresist, exposing the key area; etching the key area of the substrate; removing said first photoresist and depositing a second photoresist; developing the second photoresist, exposing the key area and a buried layer; implanting the key area and the buried layer with a dopant; removing the second photoresist; and growing an epitaxial layer on the substrate.

BRIEF DESCRIPTION OF THE DRAWINGS

FIGS. 1–3 illustrate process flow diagrams of a prior art process for producing key locators;

FIGS. 4–7 illustrate process flow diagrams of a process for producing buried layers and/or key locators;

FIGS. 8–12 illustrate process flow diagrams of a process for producing buried layers and/or key locators embodying the present invention;

DETAILED DESCRIPTION OF THE DRAWINGS

Figure 11:
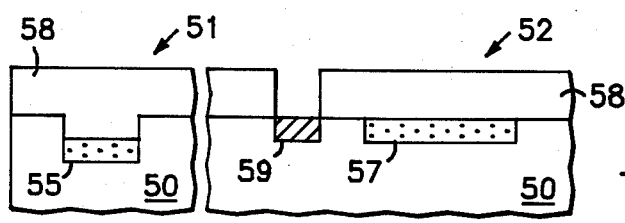

FIGS. 1–3 illustrate process flow diagrams of a prior art process of producing key locators. FIG. 1 illustrates a substrate 10 covered by a thick oxide 11, a nitride layer 12 and a photoresist 13. Photoresist 13 is patterned to expose area 14 which will designate the opening for the key area, or buried layer area.

Photoresist 13 is then developed and nitride layer 12 and oxide layer 11 are etched to expose substrate 10. A portion of substrate 10 may then be etched, and a dopant impurity deposited in key area 15. Photoresist 13 is then removed followed by the removal of oxide layer 12 and nitride layer 11. This is then annealed to drive the dopant into substrate 10, FIG. 2. If substrate 10 is not etched, delineation by oxidation can be employed here, followed by oxide removal.

As shown in FIG. 3, an epitaxial layer 16 may then be grown over substrate 10 leaving a step 17. Step 17 then serves as a pattern delineation for further processing.

FIGS. 4–7 illustrate process flow diagrams of a process of producing buried layers and/or key locators. FIG. 4 illustrates a substrate 25 covered by an oxide layer 26 which is commonly referred to as a screen oxide having a thickness of approximately 20 nm. Covering oxide layer 26 is a photoresist layer 27 which as been developed to produce an opening 28 therethrough.

In FIG. 5, a dopant impurity 29, introduced by ion implantation, is illustrated as being close to the surface of substrate 25 next to oxide layer 26. The dopant may be any suitable dopant such as arsenic, antimony, phosphorus, or the like.

Referring now to FIG. 6, photoresist layer 27 has been removed and the substrate subjected to a temperature cycle. This is described in more detail in copending application U.S. Ser. No. 878,931 which is assigned to the same assignee. The substrate oxidizes at a temperature which maintains the doped area in a metastable state. The metastable state of the highly doped area causes oxide to grow faster in this region than it grows on the surface of the substrate. The faster growth rate creates a step between the highly doped region and the silicon surface which results in the highly doped area being in a depression. Doped area 29 is driven deeper into substrate 25 during the oxidation cycle creating buried layer 30.

FIG. 7 illustrates the device after removing oxide layer 26 and growing an epitaxial layer 31. Since epi layer 31 follows the contour of substrate 25, a step 32 is formed. Step 32 acts as a pattern delineation which may be used in subsequent processing of substrate 25 for alignment purposes when providing other processing in relation to buried layer 30.

Referring now to FIGS. 8–12, process flow diagrams of a process of producing buried layers and/or key locators embodying the present invention is illustrated. FIG. 8 shows a substrate 50 divided into two portions: a portion 51 illustrating a key area; and portion 52 illustrating the simultaneous processing of a buried layer portion. A layer of photoresist 53 is deposited on substrate 50 and developed to expose an opening 54 designating the location of a key 55. Substrate 50 is then etched in the key area.

In FIG. 9 photoresist layer 53 has been removed and a second photoresist 56 deposited. Photoresist 56 is then masked exposing the locations of key 55 and buried layer 57.

In FIG. 10, photoresist 56 has been developed and the portions over key 55 and buried layer 57 removed. A dopant is then deposited and, after photoresist removal, annealed to drive it into key 55 and buried layer 57. The dopant can be any suitable dopant such as arsenic, antimony, phosphorus, or the like.

If desired, a channel stop can be added in like manner at this point. This is illustrated in FIG. 11. Photoresist 56 is removed and a third photoresist 58 is deposited over the surface of substrate 50. Photoresist 58 is then masked and developed, exposing substrate 50 where a channel stop 59 is to be located. Channel stop 59 is then doped with a dopant of an opposite conductivity type as that of buried layer 57.

Figure 12:
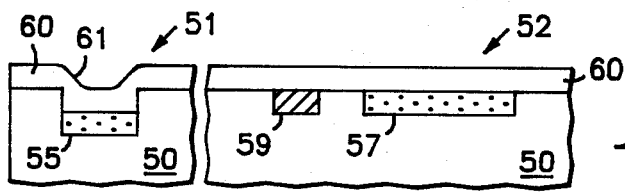

Finally, as shown in FIG. 12, photoresist 58 is removed, dopants annealed as required, and an epitaxial layer 60 is grown over substrate 50. A step 61 remains after growing epi layer 60 for future processing. Step 61 functions as a pattern delineation which will be used in subsequent processing steps.

Thus, it has been shown that the present invention provides a process that overcomes the requirement of a nitride layer and an oxide layer.

Figure 13:
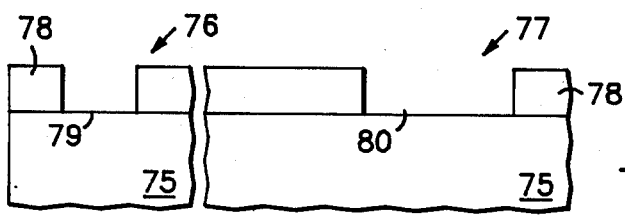
FIGS. 13–17 illustrate a second embodiment of the present invention for producing buried layers and/or key locators.

Referring now to FIGS. 13-17, a second embodiment of the present invention for producing buried layers and/or key locators is illustrated. FIG. 13 illustrates a substrate 75 divided into two portions: a key portion 76; and a buried layer portion 77. A layer of photoresist 78 has been deposited on substrate 75 and developed to expose key area 79 and buried layer area 80.

Figure 14:
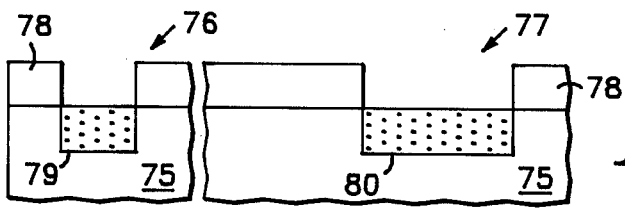

A dopant is then deposited into key area 79 and buried layer area 80, FIG. 14.

Figure 15:
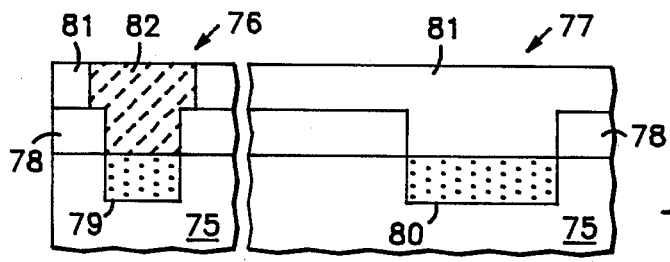

In FIG. 15, a second layer of photoresist 81 is deposited on photoresist layer 78, key area 79, and buried layer 80. Photoresist 81 is then masked and exposed about key area 79. This is illustrated by hatched area 82.

Figure 16:
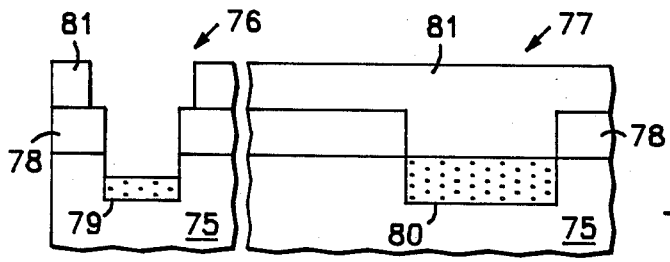
Figure 17:
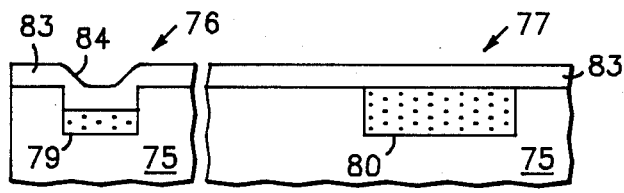

Photoresist 81 is then developed, removing portion 82. The exposed portion of key area 79 is then etched as shown in FIG. 16. Photoresists 81 and 78 are then removed, dopants annealed as required, and a layer of epitaxial silicon 83 can then be grown on the surface, as shown in FIG. 17. A step 84 remains after growing epi layer 83 which serves as a pattern delineation to be used in subsequent processing. If desired, a channel stop may be inserted prior to growing epi layer 83 as shown in FIG. 4 and accompanying text.

Thus, it has been shown that the present invention provides a process that overcomes the requirements of a nitride layer and an oxide layer.

Referring now to FIGS. 18-22 process flow diagrams of a third embodiment of the present invention are illustrated. The process flow of FIGS. 18-22 closely parallel those of the second embodiment shown in FIGS. 13-17. The elements that are the same between the second and third embodiments are identified herein by the same numbers.

Figure 18:
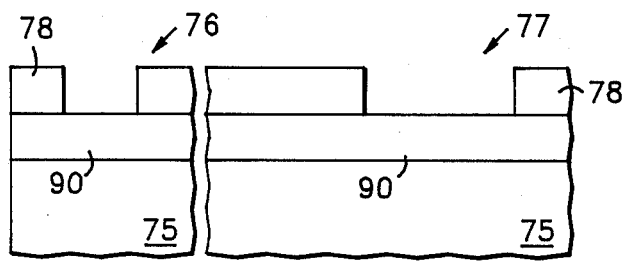
FIGS. 18–22 illustrate a third embodiment of the present invention for producing buried layers and/or key locators.

FIG. 18 shows substrate 75 with a screen oxide layer 90 deposited thereon. Photoresist 78 is then deposited on oxide 90 and developed to expose key area 79 and buried layer area 80.

Figure 19:
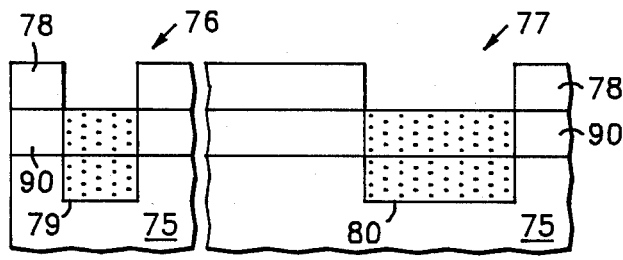

The dopant is then deposited through oxide 90 and into substrate 75 at key area 79 and buried layer area 80, FIG. 19.

Figure 20:
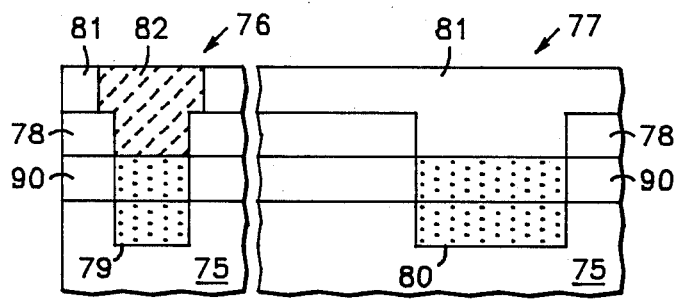

In FIG. 20, photoresist 81 is then deposited over portions 76 and 77. Photoresist 81 is then masked and exposed about key area 79. This is illustrated by hatched area 82.

Figure 21:
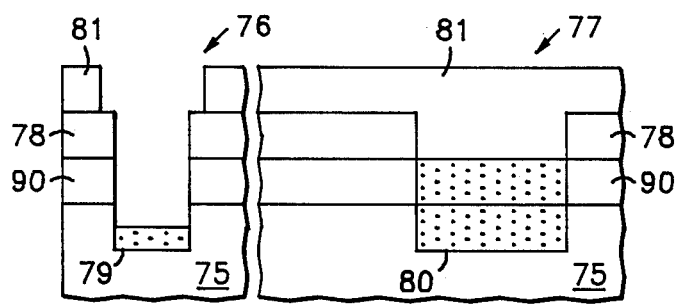
Figure 22:
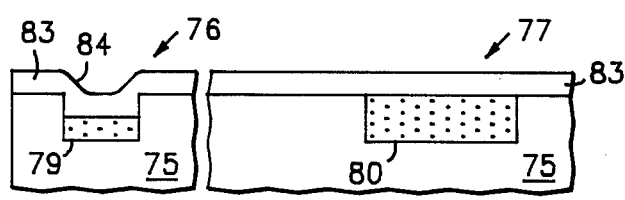

Photoresist 81 is then developed, removing portion 82; and, oxide layer 90 and a portion of substrate 75 are then etched, as shown in FIG. 21. Photoresists 81 and 78 and oxide 90 are then removed, dopants annealed as required, and epi layer 83 is grown on the surfaces of portions 76 and 77. Again, if a channel stop is desired, it may be inserted prior to growing epi layer 83. Step 84 is again provided after epi layer 83 is grown.

Thus, it is apparent to one skilled in the art that there has been provided in accordance with the invention, a device and method that fully satisfies the objects, aims and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications and variations in the appended claims.

I claim:

1. A process for developing implanted buried layers and key locators in a substrate comprising the steps of:
   growing or depositing a screen oxide on said substrate;
   depositing a first photoresist on said screen oxide;
   developing said first photoresist, exposing a key area of said screen oxide and said substrate;
   etching said key area of said screen oxide and said substrate;
   removing said first photoresist;
   depositing a second photoresist on said screen oxide;
   developing said second photoresist, exposing said key area of said substrate and a buried layer area of said screen oxide; and
   implanting said key area and said buried layer area of said substrate with a dopant of a first conductivity type.

2. The process of claim 1 further comprising the steps of:
   removing said second photoresist; and
   growing an epitaxial layer on said substrate.

3. The process of claim 2 further comprising, following the step of removing said second photoresist, the steps of:
   depositing a third photoresist on said substrate;
   developing said third photoresist, exposing a channel stop area of said substrate;
   implanting said channel stop area of said substrate with a dopant of a second conductivity type; and
   removing said third photoresist.

4. The process of claim 3 wherein said dopant of a first conductivity type is a p-type dopant and said dopant of a second conductivity type is an n-type dopant.

5. The process of claim 3 wherein said dopant of a first conductivity type is an n-type dopant and said dopant of a second conductivity type is a p-type dopant.

6. A process for developing implanted buried layers and key locators in a substrate comprising the steps of:
   depositing or growing a screen oxide on said substrate;
   depositing a first photoresist on said screen oxide;
   developing said first photoresist, exposing a key area and a buried layer area of said screen oxide and said substrate;
   implanting said key area and said buried layer area of said oxide and said substrate with a dopant of a first conductivity type;
   depositing a second photoresist;
   developing said second photoresist, exposing said key area of said oxide and said substrate; and
   etching said key area of said oxide and said substrate.

7. The process of claim 6 further comprising the steps of:

removing said second photoresist;
removing said first photoresist;
removing said screen oxide; and
growing an epitaxial layer on said substrate.

8. The process of claim 7 further comprising, following the step of removing said first photoresist, the steps of:
depositing a third photoresist on said oxide;
developing said third photoresist, exposing a channel stop area of said oxide and said substrate;
etching said channel stop area of said oxide;
implanting said channel stop area of said substrate with a dopant of a second conductivity type; and
removing said third photoresist.

9. The process of claim 8 wherein said dopant of a first conductivity type is a p-type dopant and said dopant of a second conductivity type is an n-type dopant.

10. The process of claim 8 wherein said dopant of a first conductivity type is an n-type dopant and said dopant of a second conductivity type is a p-type dopant.

* * * * *